United States Patent [19]
Denissen et al.

[11] Patent Number: 5,469,448
[45] Date of Patent: Nov. 21, 1995

[54] ENCODING/DECODING CIRCUIT, AND DIGITAL VIDEO SYSTEM COMPRISING THE CIRCUIT

[76] Inventors: Adrianus J. M. Denissen; Bernardus A. M. Zwaans, both of Groenewoudseweg 1, 5621 BA Eindhoven, Netherlands

[21] Appl. No.: 193,613

[22] Filed: Feb. 8, 1994

Related U.S. Application Data

[63] Continuation of Ser. No. 822,792, Jan. 21, 1992, abandoned.

[30] Foreign Application Priority Data

Feb. 7, 1991 [NL] Netherlands ............... 9100218

[51] Int. Cl.$^6$ ................... G06F 11/10; H03M 13/00
[52] U.S. Cl. ........................ 371/37.4; 371/37.1
[58] Field of Search ................... 371/37.4, 37.5, 371/37.7, 37.8, 37.1; 370/53, 57, 58.1, 30

[56] References Cited

U.S. PATENT DOCUMENTS

| | | | |
|---|---|---|---|
| 3,831,143 | 8/1974 | Trafton | 371/37.4 |
| 4,276,646 | 6/1981 | Haggard et al. | 371/37.4 |
| 4,742,519 | 5/1988 | Abe et al. | 371/37.4 |
| 4,852,102 | 6/1989 | Yamaguchi | 371/37.4 |
| 4,943,964 | 6/1990 | Hatanaka et al. | 371/37.4 |
| 4,965,576 | 10/1990 | Watanabe et al. | 371/37.1 |
| 4,998,252 | 3/1991 | Suzuki et al. | 371/37.5 |
| 5,038,350 | 8/1991 | Mester | 371/37.4 |
| 5,140,596 | 8/1992 | Weldon, Jr. | 371/37.5 |
| 5,192,949 | 3/1993 | Suzuki et al. | 371/37.4 |
| 5,220,568 | 6/1993 | Howe et al. | 371/37.1 |
| 5,247,523 | 9/1993 | Arai et al. | 371/37.4 |

*Primary Examiner*—Robert W. Beausoliel, Jr.
*Assistant Examiner*—Trinh Tu
*Attorney, Agent, or Firm*—Leroy Eason

[57] ABSTRACT

An integrated circuit for encoding digital data in the recording mode and decoding digital data in the reproduction mode using an error correction product code can be used in combination with a standard frame memory when use is made of a high-frequency system clock. An error correction strategy suitable for digital video is implemented in the circuit.

19 Claims, 2 Drawing Sheets

ENCODING/DECODING CIRCUIT, AND DIGITAL VIDEO SYSTEM COMPRISING THE CIRCUIT

This is a continuation of application Ser. No. 07/822,792, filed Jan. 21, 1992, now abandoned.

BACKGROUND OF THE INVENTION

The invention relates to a circuit for the encoding and decoding of digital data with an error correction code.

The invention also relates to a digital video recording/reproducing system comprising such a circuit.

In a circuit of this kind, digital data words are formed from a stream of digital data, each data word being encoded according to a particular error correction code (i.e. provided with so-called parity symbols) after which they are stored as code words on a storage medium (upon recording). Should the code words no longer correspond completely to the original code words, due to disturbances or damaging of any kind after recovery from the storage medium (upon reproduction), the redundant information in the parity symbols enables error correction upon decoding. It is often advantageous to use a combination of two error correction codes. To this end, the digital data symbols (such as bytes) can be arranged, for example, in rectangular blocks, so that data words are formed in the horizontal and the vertical direction. The horizontal data words and the vertical data words can then be protected by way of two (possibly different) codes. The codes together are also referred to as a product code. For encoding and decoding it is necessary to store the digital data temporarily block-wise in an external frame memory. In order to enable simple and fast reading and writing in such an external frame memory, accompanied by a low power dissipation and limited use of wiring, it is advantageous if one (standard) memory suffices.

SUMMARY OF THE INVENTION

The invention inter alia has for its object to provide an encoding/decoding circuit which requires only a relatively small external frame memory. To achieve this, the invention provides an encoding/decoding circuit which comprises a first sub-circuit for encoding data in the recording mode and decoding data in the reproduction mode according to a first error correction code, a second sub-circuit for encoding data in the recording mode and decoding data in the reproduction mode according to a second error correction code, a third sub-circuit for the supply of non-encoded data in the recording mode and decoded data in the reproduction mode. The first sub-circuit being suitable outputs encoded data in the recording mode and outputs decoded data in the reproduction mode. Each sub-circuit is suited to receive clock signals at its own system clock frequency. The circuit also comprises switching means controlled by a control circuit for cyclically connecting the sub-circuits to a terminal for data transfer from and to an external frame memory at a frequency which is at least equal to the sum of the frequencies of the system clocks of the sub-circuits. The switching means may be, for example multiplexers which are controlled at a frequency which is at least equal to the sum of the frequencies of the system clocks of the sub-circuits. It is thereby achieved that all three sub-circuits can communicate as if in parallel with a single external memory. The control circuit cyclically connects each time one sub-circuit to the external memory, but at such a high frequency that all sub-circuits are given access to the memory for a sufficiently long period of time. A switching cycle is determined by the frequencies of the system clocks. Therefore, the sub-circuits are not necessarily alternately connected to the memory.

When the system clocks are mutually phase shifted and have the same frequency, they can be simply derived from a clock signal having a frequency which is three times as high.

An embodiment of a circuit in accordance with the invention is characterized in that the cyclic connection of the circuits to the data transfer terminal takes place in reverse order during recording and reproduction. Initialisation problems are thus avoided.

A further embodiment of a circuit in accordance with the invention is characterized in that one code (the outer code) is a (88, 81, 8) Reed-Solomon code (with 7 parity symbols) and the other code (the inner code) is a (136, 128, 9) Reed-Solomon code (with 8 parity symbols), both over GF(256) and derived from the primitive polynomial $x^8+x^4+x^3+x^2+1$. It has been found that this product code can be readily realised and achieves suitable results.

A further embodiment of a circuit in accordance with the invention is characterized in that at the most 6 of the 8 parity symbols of the inner code serve for error/erasure correction, the remaining parity symbols serving as an additional error detection margin. Some or all of the 7 parity symbols of the outer code may serve for error/erasure correction, any remaining parity symbols serving as an additional error detection margin. This choice of the error correction strategy offers suitable results for video data. If at the most 6 of the 7 parity symbols of the output code serve for error/erasure correction, the remaining parity symbol(s) provide an additional error detection margin.

A further embodiment of a circuit in accordance with the invention is characterized in that at the most 4 of the 8 parity symbols of the inner code serve for error correction, the remaining parity symbols serving as an additional error detection margin. Some or all of the 7 parity symbols of the outer code serve for erasure correction, any remaining parity symbols serving as an additional error detection margin. This choice enables the use of a simpler first decoding circuit.

A preferred embodiment of a circuit in accordance with the invention is characterized in that at the most 6 of the 8 parity symbols of the inner code serve for error correction, the remaining parity symbols serving as an additional error detection margin and at the most 2 of the 7 parity symbols of the outer code serve for error correction and the remaining parity symbols serve for erasure correction. It has been found that when this error correction strategy is implemented in the circuit, whereby the inner code corrects at the most 3 errors, the outer code corrects at the most 1 error (a possible miscorrection by the first decoder), and the remainder corrects erasures, suitable results are obtained in practice.

A further embodiment of a circuit in accordance with the invention is characterized in that in the reproduction mode the first sub-circuit supplies the data transfer terminal only with data words that are correctable by the first error correction code. In addition to the saving as regards the operations to be carried out, this is advantageous for the variable-length encoding/decoding circuit (receiving the decoded data from the encoding/decoding circuit in accordance with the invention) for executing so-called trick modes (quick search, slow motion, etc.).

A further embodiment of a circuit in accordance with the invention is characterized in that it also comprises an internal memory for the storage of error correction information per data word for the inner code and the outer code. This saves storage space in the external SRAM.

A further embodiment of a circuit in accordance with the invention is characterized in that the control circuit generates an alarm signal when the number of unreliable data symbols per unit of time exceeds a given threshold value. Wear of the video heads or the tape used can thus be very quickly recognised.

A further embodiment of a circuit in accordance with the invention is characterized in that the encoding/decoding circuit is fully integrated. Thus, a compact circuit is realised which can be simply used in combination with a standard SRAM.

DETAILED DESCRIPTION OF THE PREFERRED EMBODIMENTS OF THE INVENTION

Figure 1:
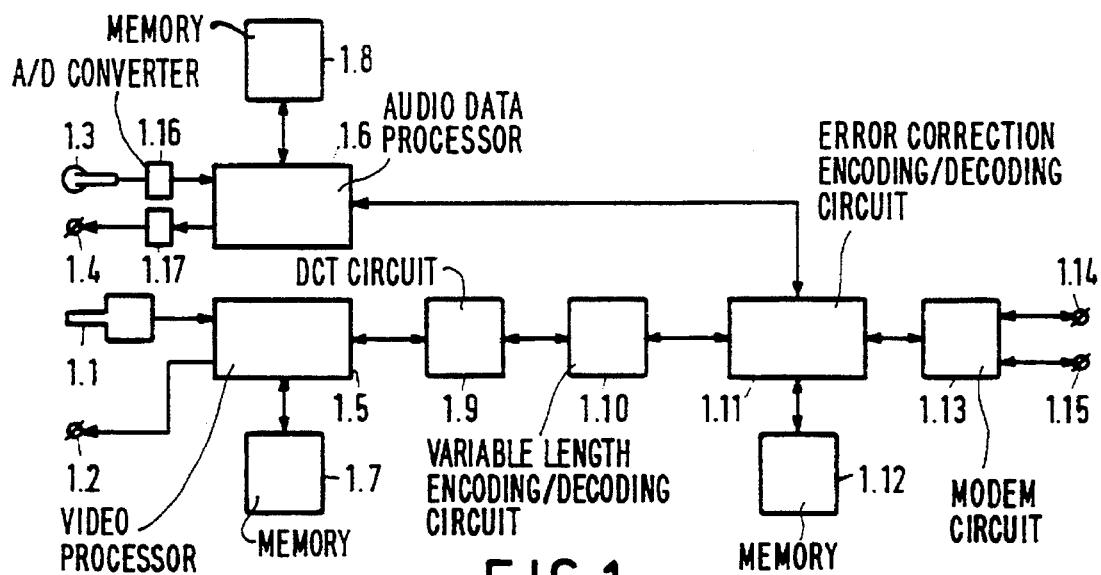
FIG. 1 shows a digital video system suitable for use of a circuit in accordance with the invention.

FIG. 1 shows a digital video recording/reproducing system which includes an encoding/decoding circuit in accordance with the invention. A digital video input unit 1.1, for example a CCD video camera generating 25 frames (50 fields) per second, each with approximately 420.000 pixels, applies digital video data to a video processor 1.5. In the video processor each two successive video fields are combined so as to form one video frame which is stored in a memory 1.7, for example a 5-Mbit DRAM. Per pixel the video data contains 8 bits of luminance information (enabling representation of 256 grey values) and chrominance information. Generally, the raster of the chrominance information is coarser than that of the luminance information, for example one chrominance value, determined by two 8-bit values, per block of 2×2 pixels. In the video processor 1.5 there are also formed blocks of 8×8 pixels, so called DCT blocks, which can be distinguished as luminance DCT blocks and chrominance DCT blocks. Four luminance DCT blocks in conjunction with their two corresponding chrominance DCT blocks form a so-called DCT unit. Each time five DCT units, obtained in the video processor 1.5 by shuffle, constitute a so-called segment. Shuffle (mixing) has an averaging effect, which is advantageous for the data reduction to be subsequently executed. Each DCT block is transformed in a known Discrete Cosine Transformation (and inverse DCT) circuit 1.9. Subsequently, per segment (i.e. 30 DCT blocks) a data compression is performed in a known variable-length encoding/decoding circuit 1.10. Therein, 30*64*8=15,360 bits are reduced to 3072 bits, using known techniques such as quantisation and variable-length encoding. Quantisation can be performed, if desired, in various ways in parallel, each time the most suitable way being chosen.

Via an analog-to-digital converter 1.16 one or more audio inputs such as microphone 1.3 supply digital audio data to the audio data processor 1.6 which is connected to a memory 1.8, for example a 256-Kbit SRAM. Generally speaking, the amount of audio data is much smaller than the amount of video data, so that the audio data need not be reduced. The audio data of the processor 1.6 (in which the data blocks are also formed) and the reduced video data of the circuit 1.10 are applied to an error correction encoding/decoding circuit 1.11 in which the data is provided with parity symbols according to a known error correction code, for example a Reed-Solomon product code. A code of this kind is described in U.S. Pat. No. 4,802,173. A number of bytes (or other data symbols) to be protected by the error correction code are arranged in a rectangular array, after which parity symbols are added to each horizontal row .and each vertical column (i.e. to each horizontal and vertical data word) in accordance with the rules of the relevant code. The data words with the added parity symbols are referred to as code words. These parity symbols enable, utilising the redundant information they represent, the correction of errors in the data symbols in the array which occur during transmission of the data symbols or due to damage of the storage medium on which they are recorded. In this respect reference is also made to Richard E. Blahut: "Theory and practice of error control codes", 1983, Addison-Wesley Publ. Comp. Inc., or N. Glover & T. Dudley: "Practical error correction design for engineers", 1982, Data System Technology Corp., Broomfield Colo.

The number of luminance DCT blocks per video frame amounts to 720/8*576/8= 90*72=6480. Per frame there are 360/8*288/8*2=3240 chrominance DCT blocks. Thus, there are 1620 DCT units per frame, or 324 segments per frame. In the case of a field frequency of 50 Hz, for recording on a video tape a frame is divided into 12 so-called tracks (in the case of a field frequency of 60 Hz, a frame is divided into 10 tracks). Each a track includes, in addition to the data symbols and the parity symbols, identification and synchronisation information. The data symbols and the parity symbols of a track are referred to hereinafter as a RS video block. Per video block, therefore, there are 27 segments. Each segment of 3072 bits (=384 bytes) forms 3 lines of 128 bytes in an RS video block. This includes 1 byte of auxiliary data AUX per line, for example, data concerning the elapsed time or the frame number. An RS video block thus comprises 81 lines of 128 bytes which form 81 horizontal data words and 128 vertical data words. Subsequently, in the circuit 1.11 the parity symbols associated with the constituent data symbols are determined for each RS video block in accordance with a Reed-Solomom product code and are added. For example, first an outer code can be applied to the vertical data words and subsequently an inner code to the horizontal data words. The standard notation for such a Reed Solomon code is RS(k+p,k,p+1), where k is the number of data symbols of the code to be protected and p is the number of parity symbols. For the outer code use can be made of an RS(88,81,8), code over GF(256) and derived from the primitive polynomial $x^8x^4+x^3+x^2+1$. For the inner code use can be made of an RS(136,128,9) code also over GF(256) and also derived from the aforesaid primitive polynomial.

To this end, the circuit 1.11 is connected to a memory 1.12, for example a 1 Mbit SRAM. The data (code words) thus encoded in the recording mode is applied to a known modulator/demodulator circuit 1.13 which modulates the data for supply to two read/write heads 1.14 and 1.15 for recording the data on, for example a magnetic tape.

For the reconstruction of the video and audio signals, the two read/write heads 1.14 and 1.15 read the code words stored on the magnetic tape and apply these words to the modulator/demodulator circuit 1.13 after which the demodulated data is corrected in the circuit 1.11 by means of the parity symbols added on the basis of the Reed-Solomon product code. First the inner code (applied to the horizontal video and audio code words) is then decoded, after which the corrected data is separated into audio data, applied to the audio processor 1.6, and video data which is subsequently decoded according to the outer code, after which it is applied to the variable length encoding/decoding circuit 1.10. The audio processor 1.6 applies an audio data, via a digital-to-analog converter 1.17, to the audio output 1.4. The variable length decoding/encoding circuit 1.10 then decodes the variable length code, thus supplementing the amount of data bits obtained to 15,360. Subsequently, this data is applied to the DCT circuit 1.9 in which the inverse Discrete Cosine Transformation is performed. The data thus produced is applied to the video processor 1.5 which renders the data suitable for and applies it to the video output 1.2.

Figure 2:
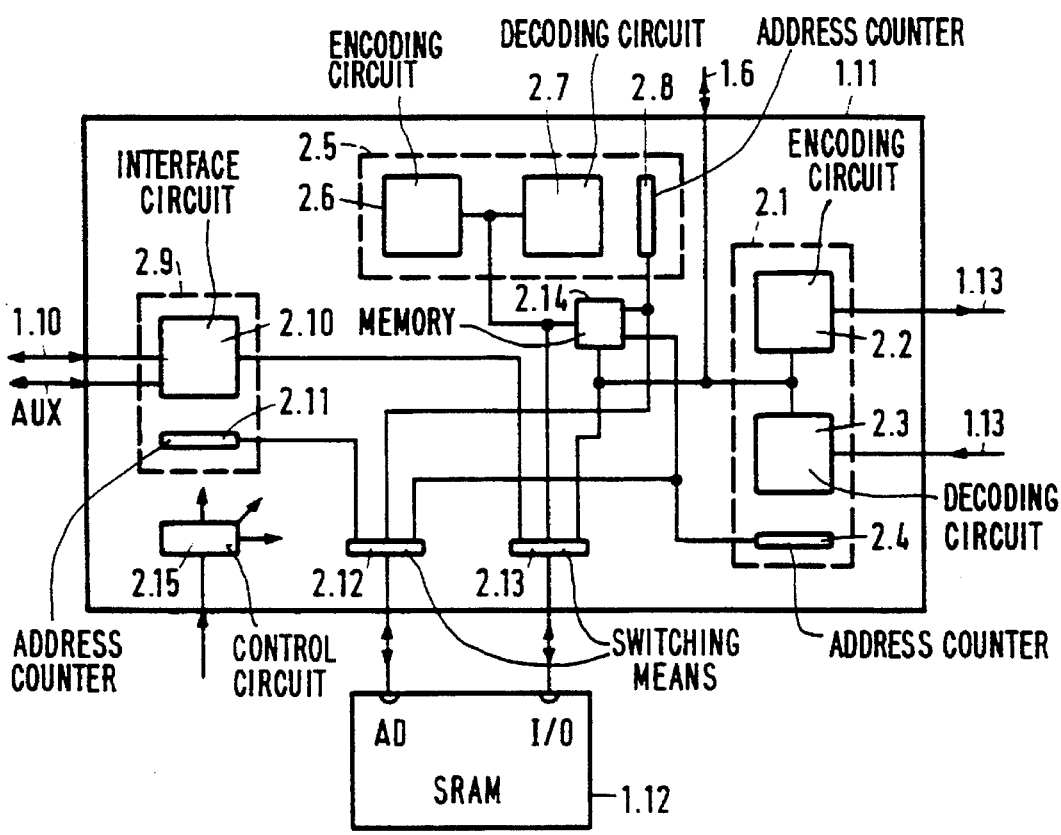
FIG. 2 shows an encoding/decoding circuit in accordance with the invention.

FIG. 2 is a detailed representation of the error correction encoding/decoding circuit 1.11 in accordance with the invention. It comprises a first subcircuit 2.1 with a first encoding circuit 2.2 for encoding data, in the recording mode, according to a first error correction code, a first decoding circuit 2.3 for decoding, in the reproduction mode, data encoded according to the first error correction code, and a first address counter 2.4; a second sub-circuit 2.5 which comprises a second encoding circuit 2.6 for encoding, in the recording mode, data according to a second error correction code, a second decoding circuit 2.7 for decoding, in the reproduction mode, data encoded according to the second error correction code, and a second address counter 2.8; a third sub-circuit 2.9 which comprises an interface circuit 2.10 for the supply of non-encoded data in the recording mode and decoded data in the reproduction mode, and a third address counter 2.11. The structure of the circuit 1.11 is such that the external memory 1.12 can be as small as possible and the necessary access to this memory is minimised. To achieve this, the circuit furthermore comprises switching means 2.12 and 2.13 which connect the sub-circuits to the external memory 1.12 under the control of a control circuit 2.15. The switching means 2.12 connect the address counters 2.4, 2.8 and 2.11 to the address input and output AD of the memory 1.12 and the switching means 2.13 connect the encoding circuit 2.2, the decoding circuit 2.3, the encoding circuit 2.6, the decoding circuit 2.7 and the interface circuit 2.10 to the data input and output I/O of the memory 1.12. Each sub-circuit is controlled by its own system clock. The system clocks are derived, for example from an external clock signal of 13.5 MHz, each system clock amounting to 4.5 MHz and being phase-shifted with respect to one another, for example through 0, 120 and 240 degrees. Thus, together they determine the frequency of 13.5 MHz used to control the switching means and the external memory by the control circuit 2.15 which receives the external clock signal, generates the system clock and the data stream and also ensures correct addressing in the circuit 1.11 and in the external memory 1.12 by means of the address counters 2.4, 2.8 and 2.11.

In the recording mode the data stream is controlled by the control circuit 2.15 as follows. The variable-length encoding/decoding circuit 1.10 applies non-encoded (as regards the error correction code to be added) data to the interface circuit 2.10, which data is row-wise written into the external SRAM 1.12, under the control of the 4.5 MHz system clock of the third sub-circuit, via the switching means. Under the control of the control circuit 2.15, the address counter 2.11 then acts as a pointer in the external memory. Any auxiliary data AUX can also be applied to the external memory via the interface circuit 2.10. As described above, the data symbols are arranged in 81 rows and 128 columns of bytes per RS video block, so that 81 horizontal data words of 128 bytes and 128 vertical data words of 81 bytes are formed per RS video block 81. Under the control of the 4.5 MHz system clock of the second sub-circuit, a vertical data word is read from the external SRAM, after which this data word is encoded in the second encoding circuit 2.6 according to the second (outer) error correction code (i.e. the associated parity symbols are determined), after which the calculated (vertical) parity symbols associated with the second error correction code are written into the external SRAM, so that the entire code word associated with the relevant vertical data word is stored in the SRAM. Under the control of the control circuit 2.15, the address counter 2.8 then acts as a further pointer in the external memory. Under the control of the 4.5 MHz system clock of the first sub-circuit, a horizontal data word is read from the external SRAM, after which this data word is encoded according to the first (inner) error correction code in the first encoding circuit 2.2, after which the data word, together with the calculated (horizontal) parity symbols associated with the first error correction code (i.e. the horizontal code word), is not stored but applied directly to the modulator/demodulator circuit 1.13. Under the control of the control circuit 2.15 the address counter 2.4 then acts as a further pointer in the external memory. The previously determined vertical parity symbols of the second (outer) error correction code also form horizontal data words which are thus processed in the first encoding circuit 2.2. In alternation with this processing of video data in the circuit 2.2, audio data is also processed (for example in a multiplex fashion): the audio processor 1.6 applies audio data to the circuit 2.2 which provides this data with parity symbols associated with the first error correction code, after which the data is applied, together with the associated, calculated parity symbols, to the modulator/demodulator circuit 1.13.

In the reproduction mode the data stream is processed as follows. The modulator/demodulator circuit 1.13 applies data to the first decoding circuit 2.3 which determines, on the basis of the identification information generated in and despatched by the circuit 1.13, whether the encoded horizontal data word (i.e. horizontal code word) concerns audio data or video data. Audio data is decoded according to the first (inner) error correction code and is applied to the audio processor 1.6; video data is decoded according to the first (inner) error correction code and, if correctable, it is written into the external memory 1.12 under the control of the 4.5 MHz system clock of the first sub-circuit. Under the control of the control circuit 2.15, the address counter 2.,, then acts as a pointer in the external memory. The addresses at which the data is stored in the memory are contained in the identification information generated in the circuit 1.13. Under the control of the 4.5 MHz system clock of the second sub-circuit, the second decoding circuit 2.7 reads vertical encoded data words (i.e. vertical video code words) from the external SRAM, decodes these words according to the second error correction code, and writes only those data symbols of each relevant data word into the external memory 1.12 that have been corrected by decoding. Under the control of the control circuit 2.15, the address counter 2.8 then acts as a further pointer in the external memory. Under the control of the 4.5 MHz system clock of the third sub-circuit, the decoded data is read from the external memory 1.12 and applied to the variable-length encoding/decoding circuit 1.10 or is output as auxiliary data AUX. The address counter 2.11 then acts as a further pointer in the external memory under the control of the control circuit 2.15.

Figure 3:
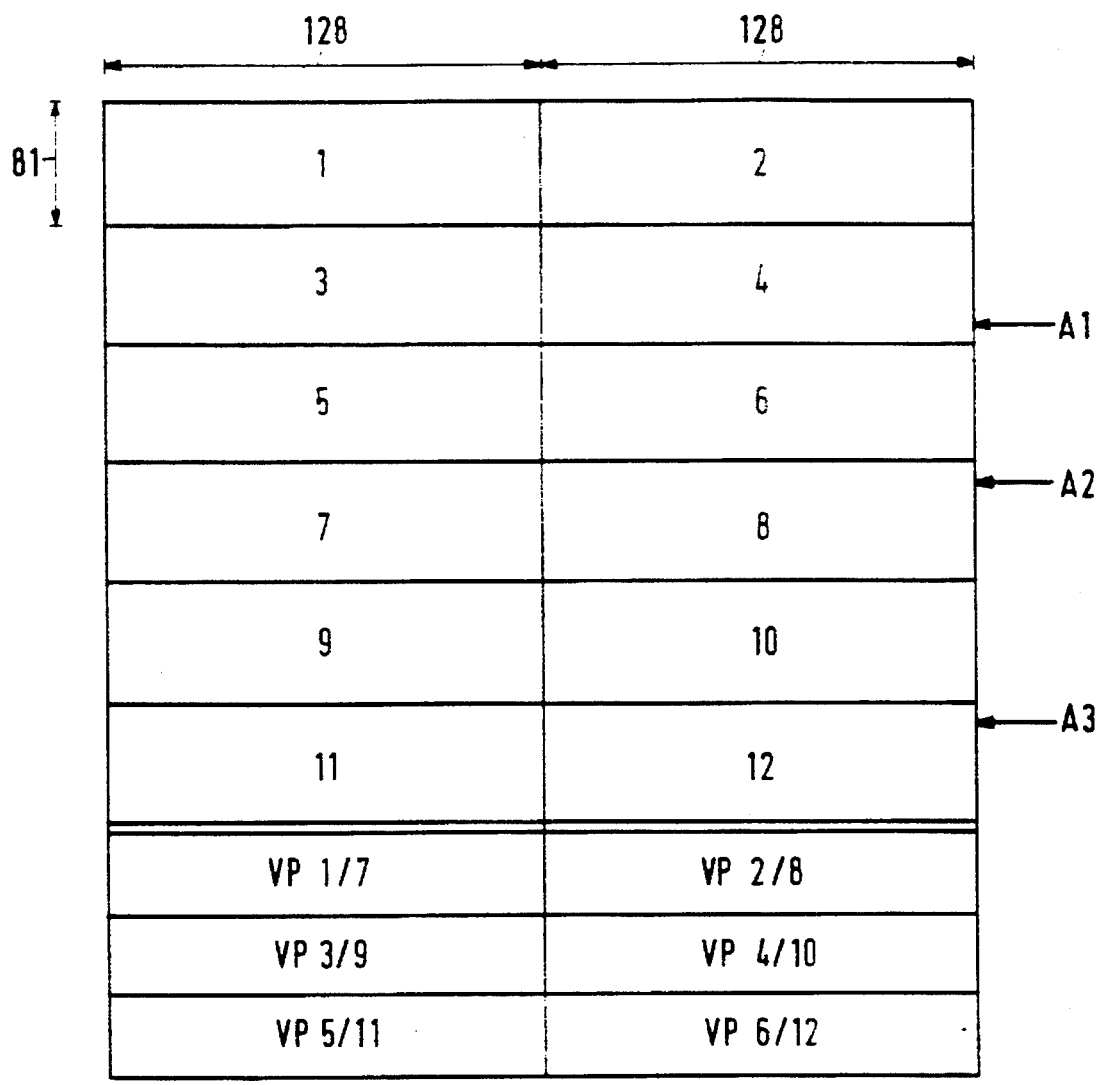
FIG. 3 illustrates the use of the external frame memory.

A storage capacity of 128*81*12*8=995328 bits (# bytes per line times # lines per RS video block times # RS video blocks per frame # bits per byte) is required for the storage of a complete frame in the external memory. A 1-Mbit SRAM can be used as a standard memory; this is approximately 1049 Kbits. The remaining 53 Kbit is used for the storage of the further parity symbols of 6 RS video blocks of the relevant frame, see FIG. 3. The address counters or pointers A1, A2 and A3 (associated with the respective sub-circuits) cyclically and simultaneously scan the external memory, the control circuit 2.15 ensuring that the pointers do not overtake one another and hence can proceed in the rhythm of their system clock. The simultaneous cyclic scanning of the external memory under the control of the control circuit 2.15 takes place in the reverse order during the recording mode and the reproduction mode. Moreover, the vertical parity symbols of 6 RS video blocks are cyclically stored in the appropriate storage spaces VP1/7 to VP6/12. The storage space VP1/7, for example contains the parity symbols of the RS video block 1 or of the RS video block 7, depending on the phase in the cycle of the address counters. The control circuit 2.15 ensures that in the recording mode the address counter A2 erases the relevant vertical parity symbols only after they have been read by the address counter A1, and that in the reproduction mode the address counter A1 erases the relevant vertical parity symbols only after they have been read by the address counter A2. The specification of the 1 Mbit SRAM to be used is: 128 Kbit * 8, frequency 13.5 MHz, bidirectional 8-bit data bus.

As has already been described, the Reed-Solomon product code used employs an outer code which operates on the vertical data words and an inner code which operates on the horizontal data words. The inner code has 8 parity symbols and the outer code has 7 parity symbols. The error correction strategy is as follows. The inner code serves to correct single bit errors (incidental errors) and to detect burst errors (string of bit errors). The outer code serves to correct horizontal detected errors (erasures) and to correct any miscorrections by the horizontal decoder. To this end, 6 of the 8 parity symbols of the inner code can be used to correct at the most 3 errors. The remaining 2 parity symbols then serve as an additional detection margin. Thus, the results of the correction calculation (6 equations with 6 unknowns) are inserted in the remaining seventh and eighth equation for checking purposes, so that additional certainty is obtained as regards the correctness of the calculated corrections. The probability of a miscorrection then amounts to approximately $3*10^{-7}$ for the horizontal decoder (see, for example R. J. McEliece & L. Swanson: "On the decoder error probability for Reed-Solomon codes", IEEE Transactions on Inform. Th., IT-32, 5, 1986, pp. 701–703). When more than 3 errors are detected in a horizontal data word, evidently a burst error is concerned. In that case the entire data word is not written into the SRAM, but is made an erasure in its entirety by means of a correction bit as will be described hereinafter. The corresponding preceding data word from the previous frame then remains in the memory. Alternatively, 4 of the 8 parity symbols of the inner code can be used for the correction of at the most 2 errors. In that case the remaining 4 parity symbols are used as an additional detection margin. The 7 parity symbols of the outer code can all be used for the correction of at the most 7 detected erasures. Another possibility consists in that 2 parity symbols axe used for the correction of 1 error and the remaining 5 parity symbols axe used for the correction of detected erasures. Any miscorrection occurring can thus also be corrected. One parity symbol can also be used as an additional detection margin.

The inner code and the outer code thus cooperate: the inner code corrects small random errors, and detects burst errors so that the outer code already s provided with the location of the erasures thus corrected. In order to enable such cooperation between the inner and the outer decoder, the circuit 1.11 comprises an embedded SRAM 2.14 (see FIG. 2), connected to the address counters 2.4 and 2.8, the encoding circuits 2.2 and 2.6, and the decoding circuits 2.3 and 2.7 of the first and the second sub-circuit. In the reproduction mode, after the decoding of the video data according to the first (inner) error correction code in the circuit 2.3 and the writing of only the correctable (corrected or errorless) horizontal data words into the memory 1.12, a so-called correction bit is stored in the memory 2.14 for each horizontal data word. This correction bit indicates whether or not the relevant data word was correctable by means of the inner code (corrected or errorless and hence now correct). Any miscorrections, for which the probability of occurrence is very small, axe ignored in this respect. When the data word is correct, the correction bit has the logic value 1 and otherwise the logic value 0. Each correction bit having the value 0 is thus associated with a horizontal data word consisting of erasures. When the second decoding circuit 2.7 reads the vertical code words from the external memory in the reproduction mode, the correction bits associated with the horizontal data words are also read from the memory 2.14. The outer decoding circuit thus is given the locations of the erasures to be corrected. The memory 2.14 also stores for the vertical data words whether they axe correct. When the data word is correct the correction bit has the logic value 1, and otherwise has the logic value 0. The control circuit can thus provide a reliability indication for each byte: if the horizontal data word or the vertical data word containing the relevant byte is correct (i.e. if at least one of the two correction bits of relevance to the byte has the logic value 1), the byte is reliable. This reliability information can be applied, via the circuit 2.10, to the variable length encoding/decoding circuit 1.10. Moreover, when a given threshold value concerning the number of unreliable bytes is exceeded, an indication signal can be generated to indicate that the quality of the tape or the heads is insufficient.

In the reproduction mode, time can be saved as follows during the decoding of the vertical code words by the second (outer) decoding circuit 2.7. When the Reed-Solomon decoder circuit generates the difference value between the correct value and the incorrect value during the correction of an erasure (i.e. the calculation of the correct value of an incorrect byte whose location is known), it is advantageous to enter the value "O" into the decoding circuit. This is because the circuit then generates directly the correct value which need merely be written into the external memory.

It is to be noted that when use is made of an external SRAM 1.12 which cannot be operated at a clock frequency as high as 13.5 MHz, it is possible to use a 16-bit data bus structure instead of an 8-bit data bus structure, so that the frequency can be halved. In that case, for example, two standard 1-Mbit memories can be used in parallel using the same addressing, the 8 bits presented by the sub-circuits then being buffered as 16 bits which are each time split into 8-bit portions by the switching means 2.13, said portions being applied to the respective data inputs and outputs I/O of the two memories at half the frequency. Conversely, the 8-bit portions supplied at half the frequency by the two memories are then combined to 16 bits by the switching means, each time 8 bits thereof being applied to the sub-circuits at the original frequency.

We claim:

1. An encoding/decoding circuit having a first operating mode as an encoder for encoding successive blocks of a series of data words supplied thereto, the data words in each block being sequentially encoded in accordance with first and second error protection codes to thereby form code words in each of said codes for recording on a record carrier; said circuit also having a second operating mode as a decoder for decoding each of successive blocks of recorded code words recovered from the record carrier, each recovered block of code words being sequentially decoded in accordance with said first and second error protection codes in reverse order to thereby recover decoded data words; said circuit comprising:

a first, a second and a third sub-circuit;

said first sub-circuit comprising: a first encoder for receiving a block of a first series of code words which has already been formed by the second sub-circuit in accordance with the second error protection code, said first encoder encoding said block of supplied data words in accordance with the first error protection code to thereby derive a second series of code words, said first and second series of code words being for recording on the record carrier; and a first decoder for receiving from the record carrier a block of code words which has been recorded thereon and decoding said block in accordance with the first error protection code to thereby derive a block of partially decoded code words; said first sub-circuit having a first system clock frequency;

said second sub-circuit comprising: a second encoder for also receiving a block of supplied data words and encoding in accordance with the second error protection code to form said first series of code words; and a second decoder for receiving said block of partially decoded code words and decoding in accordance with the second error protection code to thereby derive decoded data words, the decoded data words being data words from which the recorded block of code words was derived; said second sub-circuit having a second system clock frequency;

said third sub-circuit comprising interface means for receiving the supplied data words at a data word clock frequency and outputting the supplied data words to be encoded by said second encoder; said interface means also receiving the decoded data words derived by said second decoder and outputting said decoded data words at said data word clock frequency; said third sub-circuit having a third system clock frequency;

a frame memory for providing intermediate storage of (i) blocks of supplied data words outputted by said interface means, (ii) blocks of partially decoded code words produced by said first decoder from code words recorded on the record carrier, and (iii) blocks of decoded data words derived by said second decoder for supply to said interface means;

switching means coupled to each of said sub-circuits and to said frame memory for providing cyclically multiplexed access to said frame memory by each of said sub-circuits; and control means for controlling said switching means so that said cyclically multiplexed access to said frame memory is at a frequency at least equal to the sum of said first, second and third system clock frequencies, whereby each of said sub-circuits is provided with cyclically multiplexed access to said frame memory at a frequency corresponding to the system clock frequency of the relevant sub-circuit.

2. A circuit as claimed in claim 1, wherein the three sub-circuits clocks have the same frequency and are mutually phase shifted.

3. A circuit as claimed in claim 1, wherein said cyclically multiplexed accessed of the sub-circuits to said frame memory is in mutually reverse order during said first and second operating modes of said circuit.

4. A circuit as claimed claim 1, wherein the first and second error protection codes are an inner code and an outer code, respectively, of a Reed-Solomon product code, each code word in each of said codes having a plurality of data symbols and a plurality of parity symbols.

5. A circuit as claimed in claim 4, wherein the outer code is a (88,81,8) Reed-Solomon code (with 7 parity symbols) and the inner code is a (136,128,9) Reed-Solomon code (with 8 parity symbols), both over GF(256) and derived from a primitive polynomial $x^8+x^4+x^3+x^2+1$.

6. A circuit as claimed in claim 5, wherein at the most 6 of the 8 parity symbols of the inner code serve for error/erasure correction, the remaining parity symbols serving as an additional error detection margin, up to all the 7 parity symbols of the outer code serving for error/erasure correction, any remaining parity symbols serving as an additional error detection margin.

7. A circuit as claimed in claim 5, wherein at the most 6 of the 8 parity symbols of the inner code serve for error/erasure correction, the remaining parity symbols serving as an additional error detection margin, at the most 6 of the 7 parity symbols of the outer code serving for error/erasure correction, the remaining parity symbol(s) serving as an additional error detection margin.

8. A circuit as claimed in claim 5, wherein at the most 4 of the 8 parity symbols of the inner code serve for error correction, the remaining parity symbols serving as an additional error detection margin, up to all of the 7 parity symbols of the outer code serving for erasure correction and any remaining parity symbols serving as an additional error detection margin.

9. A circuit as claimed in claim 5, wherein at the most 6 of the 8 parity symbols of the inner code serve for error correction, the remaining parity symbols serving as an additional error detection margin, at the most 2 of the 7 parity symbols of the outer code serving for error correction, the remaining parity symbols serving for erasure correction.

10. A circuit as claimed in claim 9, wherein at the most 2 of the 7 parity symbols of the outer code serve for error correction, at least 1 of the remaining parity symbols serving as an additional error detection margin.

11. A circuit as claimed in claim 4, further comprising an auxiliary memory for the storage of correction information per data word for the inner code and the outer code.

12. A circuit as claimed in claim 11, wherein the control circuit generates a reliability signal per data symbol from the correction information per data word for the inner code and the outer code.

13. A circuit as claimed in claim 12, wherein the control circuit generates an alarm signal when the number of unreliable data symbols per unit of time exceeds a given threshold value.

14. A circuit as claimed in claim 1, wherein during said second operating mode the first sub-circuit supplies said memory only with data words that are correctable by the first error protection code.

15. A circuit as claimed in claim 1, wherein the frame memory is a 1-Mbit SRAM.

16. A circuit as claimed in claim 1, wherein the supplied data words comprise video data words.

17. A circuit as claimed in claim 1, wherein all three of said sub-circuits are comprised in an integrated circuit and said frame memory is external to said integrated circuit.

18. A circuit as claimed in claim 1, wherein the supplied data words and the encoded and decoded code words each comprises multi-bit symbols.

19. A circuit as claimed in claim 1, wherein the supplied data words comprise video data words and audio data words, the third sub-circuit receives only the supplied video data words, the supplied audio data words being provided to the first encoder and being encoded thereby into audio code words in accordance with the first error protection code, and recorded audio code words recovered from said record carrier are received by said first decoder and decoded thereby in accordance with the first error protection code.

* * * * *